(12) United States Patent
Sugimura

(10) Patent No.: US 9,966,768 B2
(45) Date of Patent: May 8, 2018

(54) SEMICONDUCTOR DEVICE AND BATTERY VOLTAGE MEASURING METHOD THAT PREVENTS MEASUREMENT ERROR CAUSED BY PARAMETRIC CAPACITANCE

(71) Applicant: LAPIS Semiconductor Co., Ltd., Kanagawa (JP)

(72) Inventor: Naoaki Sugimura, Kanagawa (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 312 days.

(21) Appl. No.: 14/974,392

(22) Filed: Dec. 18, 2015

(65) Prior Publication Data
US 2016/0190832 A1   Jun. 30, 2016

(30) Foreign Application Priority Data

Dec. 25, 2014   (JP) .................................. 2014-263050

(51) Int. Cl.
*H02J 7/00* (2006.01)
*H03L 5/00* (2006.01)
*G01R 31/36* (2006.01)

(52) U.S. Cl.
CPC ........ *H02J 7/0021* (2013.01); *G01R 31/3658* (2013.01); *H02J 7/0019* (2013.01)

(58) Field of Classification Search
CPC ...... H02J 7/0021; H02J 7/0019; H02J 7/0016; G01R 31/3658; Y02E 60/12; Y02T 10/7055; H03K 19/018521; H03K 3/356113; H03K 19/00315; H03K 17/102; H03K 3/012

USPC ........................................... 320/116; 327/333
See application file for complete search history.

(56) References Cited

U.S. PATENT DOCUMENTS

| | | | | |
|---|---|---|---|---|
| 2011/0260770 A1* | 10/2011 | Sekiguchi | ............ | G01R 31/362 327/333 |
| 2012/0081167 A1* | 4/2012 | Ban | ........................ | H02J 7/0021 327/333 |
| 2013/0110430 A1* | 5/2013 | Nishi | .................... | H01M 10/48 702/63 |

FOREIGN PATENT DOCUMENTS

JP        2011-232161 A      11/2011

* cited by examiner

*Primary Examiner* — Yalkew Fantu
*Assistant Examiner* — Mohammed J Sharief
(74) *Attorney, Agent, or Firm* — Volentine & Whitt, PLLC

(57) ABSTRACT

The present disclosure provides a semiconductor device including: a first buffer amplifier into which a voltage of a high potential side of one battery cell selected from plural battery cells that are connected in series is input; a second buffer amplifier into which a voltage of a low potential side of the one battery cell other than a lowermost stage battery cell is input; an analog level shifter into which a voltage output from the first buffer amplifier and a voltage output from, the buffer amplifier are input; a first switch that switches a voltage input to the analog level shifter from the voltage output from the second buffer amplifier to a reference voltage; and a second switch that switches a voltage input to the first buffer amplifier from the voltage of the high potential side of the one battery cell to the reference voltage.

4 Claims, 8 Drawing Sheets

SEMICONDUCTOR DEVICE AND BATTERY VOLTAGE MEASURING METHOD THAT PREVENTS MEASUREMENT ERROR CAUSED BY PARAMETRIC CAPACITANCE

CROSS-REFERENCE TO RELATED APPLICATION

This application claims priority under 35 USC 119 from Japanese Patent Application No. 2014-263050, filed on Dec. 25, 2014, the disclosure of which is incorporated by reference herein.

BACKGROUND

Technical Field

The present disclosure relates to a semiconductor device and a battery voltage measuring method.

Related Art

Conventionally, high voltage is generated by using an assembled battery including plural battery cells that are connected in series (in multiple-stage). Generally, a battery voltage of the battery cell included in the assembled battery is measured by a semiconductor device for measuring a battery voltage and is connected to the assembled battery.

In such semiconductor device for measuring the battery voltage, a technology including an analog level shifter, to which a voltage of a high potential side and a voltage of the low potential side of the battery cell are input, that measures a battery voltage based on a difference between the voltage of the high potential side and the voltage of the low potential side, is known (see for example, Japanese Patent Application Laid-Open (JP-A) No. 2011-232161).

Recently, in the semiconductor devices for measuring battery voltage are required to reduce its number of terminals. In a case in which the numbers of terminals are reduced, package sizes may be reduced, and thus, the devices may be downsized.

However, in the technique disclosed in JP-A No. 2011-232161, in a case in which the number of input terminals to which a voltage corresponding to the battery voltage of the battery cell is input are reduced, a parasitic capacitance occurs, and thus, a voltage corresponding to electric charges accumulated in the parasitic capacitance may result as an error. Accordingly, is the above case, there may be cases in which the battery voltage cannot be accurately measured.

SUMMARY

The present disclosure provides a semiconductor device and a battery voltage measuring method that may prevent a measurement error caused by a parasitic capacitance generated when the battery voltage is measured.

A first aspect of the present disclosure is a semiconductor device including: a first buffer amplifier into which a voltage of a high potential side of one battery cell is input, the one battery cell selected from plural battery cells that are connected in series from a lowermost stage battery cell to an uppermost stage battery cell; a second buffer amplifier into which a voltage of a low potential side of the one battery cell selected from the plural battery cells other than the lowermost stage battery cell is input; an analog level shifter into which a voltage output from the first buffer amplifier and a voltage output from the buffer amplifier are input; a first switch that switches a voltage input to the analog level shifter from the voltage output from the second buffer amplifier to a reference voltage; and a second switch that switches a voltage input to the first buffer amplifier from the voltage of the high potential side of the one battery cell selected from the plural battery cells to the reference voltage.

A second aspect of the present disclosure is a battery voltage measuring method using a semiconductor device including, a first buffer amplifier into which a voltage of a high potential side of one battery cell is input, the one battery cell selected from plural battery cells that are connected in series from a lowermost stage battery cell to an uppermost stage battery cell, a second buffer amplifier into which a voltage of a low potential side of the one battery cell selected from the plural battery cells other than the lowermost stage battery cell is input, an analog level shifter into which a voltage output from the first buffer amplifier and a voltage output from the buffer amplifier are input, a first switch that switches a voltage input to the analog level shifter from the voltage output from, the second buffer amplifier to a reference voltage, and a second switch that switches a voltage input to the first buffer amplifier from the voltage of the high potential side of the one battery cell selected from the plural battery cells to the reference voltage, the method including: selecting the lowermost stage battery cell, inputting a voltage of a high potential side of the lowermost stage battery cell to the first buffer amplifier, and controlling the first switch so as to input the reference voltage to the analog level shifter, in a case in which the battery voltage of the lowermost stage battery cell is measured; selecting a battery cell to be measured, inputting the voltage of a high potential side of the battery cell to be measured to the first buffer amplifier, and inputting a voltage of a low potential side of the battery cell to be measured into the analog level shifter, in a case in which the battery voltage of the battery cell other than the lowermost stage battery cell is measured; and controlling the second switch so as to input the reference voltage to the first buffer amplifier before the battery voltage of the lowermost stage battery cell is measured.

According to the above aspects, the present disclosure may prevent a measurement error caused by a parasitic capacitance generated when the battery voltage is measured.

BRIEF DESCRIPTION OF THE DRAWINGS

Exemplary embodiments will be described in detail based on the following figures, wherein.

DETAILED DESCRIPTION

Hereinafter, a semiconductor device for measuring a battery voltage according to the present disclosure will be described with reference to the drawings.

Figure 1:
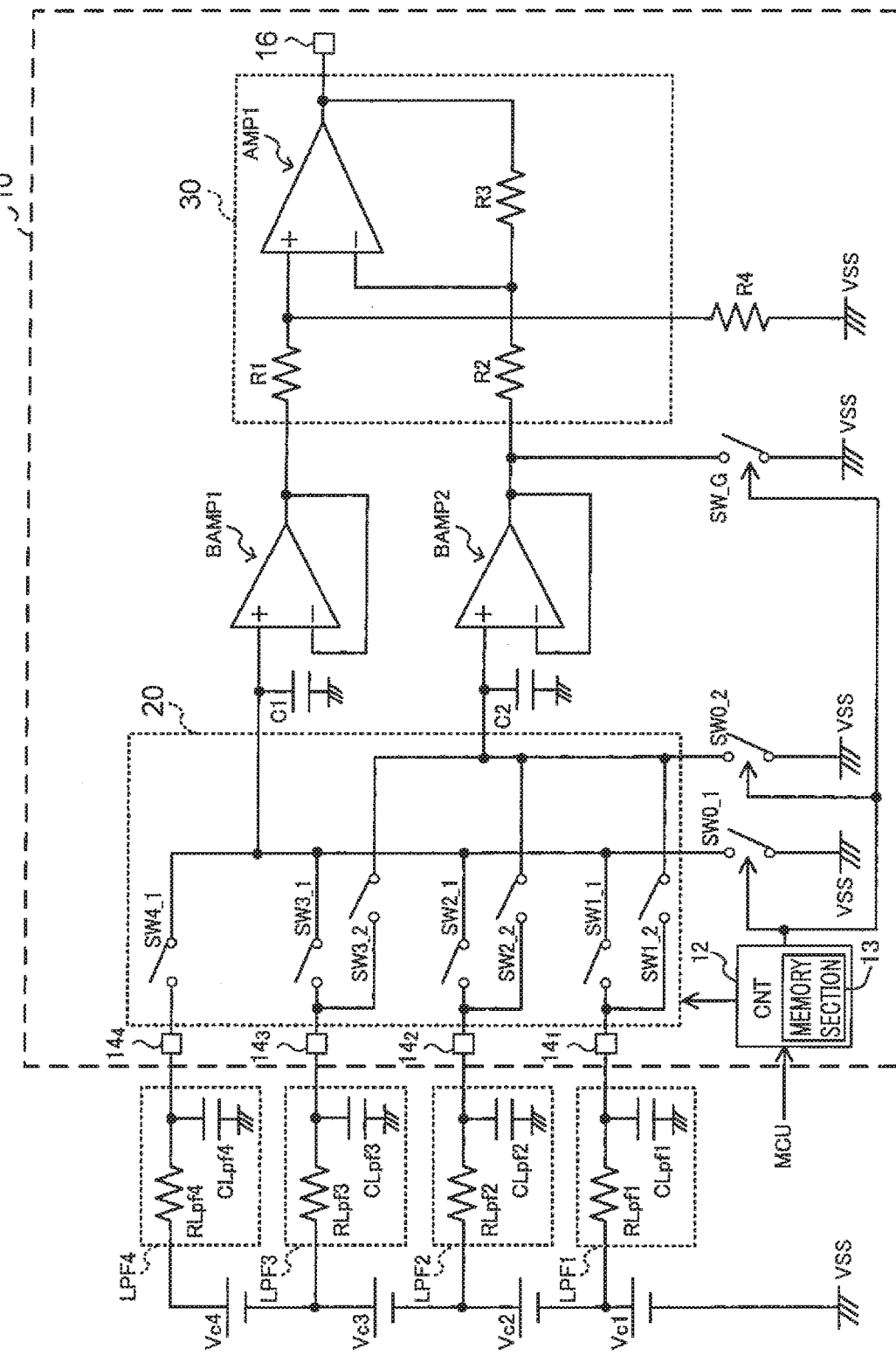
FIG. 1 is a circuit diagram of a semiconductor de vice according to the present exemplary embodiment.

First, a configuration of the semiconductor device according to the present exemplary embodiment will be described with reference to the drawing. FIG. 1 illustrates a circuit diagram of the semiconductor device 10 according to the exemplary embodiment.

As illustrated in FIG. 1, the semiconductor device 10 according to the exemplary embodiment includes a control section (hereinafter referred to as "CNT") 12, input terminals $14_1$ to $14_4$ (hereinafter collectively referred to as "input terminal 14"), an output terminal 16, a switch group 20, an analog level shifter 30, buffer amplifiers BAMP1 and BAMP2, and switches SW0_1, SW0_2, and SW_G.

The semiconductor device 10 according to the exemplary embodiment measures each battery voltage of four battery cells Vc1 to Vc4 (hereinafter collectively referred to as "battery cell Vc"), respectively. The battery cells Vc1 to Vc4 are connected in series from the battery cell Vc1 as a lowermost stage battery cell to the battery cell Vc4 as an uppermost stage battery cell. Note that, in the present exemplary embodiment, in the battery cell Vc connected in series, highest potential side of the battery cell Vc is referred to as the uppermost stage and lowest potential side of the battery cell Vc is referred to as the lowermost stage. Specific examples of the battery cell include a nickel hydrogen battery and a lithium ion battery.

The battery cells Vc1 to Vc4 are connected to the semiconductor device 10 through low pass filters LPF1 to LPF4 (hereinafter collectively referred to as "low pass filter LPF"), respectively. Each of the low pass filters LPF1 to LPF4 according to the present exemplary embodiment is an RC filter in which a resistance element RLpf (RLpf1 to RLpf4) and a capacitance element CLpf (CLpf1 to CLpf4) are combined.

More specifically, a voltage of the high potential side of the battery cell Vc1 (a voltage of the low potential side of the battery cell Vc2) is input to the input terminal $14_1$ of the semiconductor device 10 through the low pass filter LPF1. A voltage of the high potential side of the battery cell Vc2 (a voltage of the low potential side of the battery cell Vc3) is input to the input terminal $14_2$ of the semiconductor device 10 through the low pass filter LPF2. A voltage of the high potential side of the battery cell Vc3 (a voltage of the low potential side of the battery cell Vc4) is input to the input terminal $14_3$ through the low pass filter LPF3. Furthermore, a voltage of the high potential side of the battery cell Vc4 is input to the input terminal $14_4$ through the low pass filter LPF4.

The switch group 20 includes switches SW1_1, SW1_2, SW2_1, SW2_2, SW3_1, SW3_2, and SW4_1. Hereinafter, the switches included in the switch group 20 are collectively referred to as "switches SW of the switch group 20". Further, hereinafter, the switch SW of the switch group 20, the switches SW0_1, SW0_2, and SW_G are collectively referred to as "all of the switches SW of the semiconductor device 10".

The switch SW1_1 connects the input terminal $14_1$ and a non-inverting input terminal of the buffer amplifier BAMP1 when turned ON. The switch SW1_2 connects the input terminal $14_1$ and a non-inverting input terminal of the buffer amplifier BAMP2 when turned ON. The switch SW2_1 connects the input terminal $14_2$ and the non-inverting input terminal of the buffer amplifier BAMP1 when turned ON. The switch SW2_2 connects the input terminal $14_2$ and the non-inverting input terminal of the buffer amplifier BAMP2 when turned ON. The switch SW3_1 connects the input terminal $14_3$ and the non-inverting input terminal of the buffer amplifier BAMP1 when turned ON. The switch SW3_2 connects the input terminal $14_3$ and the non-inverting input terminal of the buffer amplifier BAMP2 when turned ON. The switch SW4_1 connects the input terminal $14_4$ and the non-inverting input terminal of the buffer amplifier BAMP1 when turned ON.

The analog level shifter 30 includes resistance elements R1, R2, and R3, and an amplifier AMP1.

A voltage output from the buffer amplifier BAMP1 is input to a non-inverting input terminal of the amplifier AMP1 through the resistance element R1. A first terminal of a resistance element R4 is connected to a node between the non-inverting input terminal of the amplifier AMP1 and the resistance element R1, and second terminal of the resistance element R4 is connected to a reference voltage VSS.

One of a voltage output from the buffer amplifier BAMP2 or the reference voltage VSS, which is an example of the reference voltage, through the switch SW_G is input to an inverting input terminal of the amplifier AMP1 through the resistance element R2. The amplifier AMP1 (the analog level shifter 30) outputs a voltage corresponding to a difference between the voltage output from the buffer amplifier BAMP1 and the voltage output from the buffer amplifier BAMP2, or a voltage corresponding to a difference between the voltage output from the buffer amplifier BAMP1 and the reference voltage VSS. The voltage output from the analog level shifter 30 is output to an internal circuit or an external circuit of the semiconductor device 10 through the output terminal 16.

The switch SW0_1 switches a voltage input to the non-inverting input terminal of the buffer amplifier BAMP1. In a case in which the switch SW0_1 is turned ON, the reference voltage VSS is input to the non-inverting input terminal of the buffer amplifier BAMP1. Meanwhile, in a case in which the switch SW0_1 is turned OFF, a voltage of the high potential side of the battery cell Vc in which a battery voltage is to be measured, is input to the non-inverting input terminal of the buffer amplifier BAMP1.

The switch SW0_2 switches a voltage input to the non-inverting input terminal of the buffer amplifier BAMP2. In a case in which the switch SW0_2 is turned ON, the reference voltage VSS is input to the non-inverting input terminal of the buffer amplifier BAMP2. Meanwhile, in a case in which the switch SW0_2 is turned OFF, a voltage of the low potential side of the battery cell Vc in which the battery voltage is to be measured, is input to the non-inverting input terminal of the buffer amplifier BAMP2.

The switch SW_G switches a voltage input to the inverting input terminal of the amplifier AMP1. In a case in which the switch SW_G is turned ON, the reference voltage VSS is input to the inverting input terminal of the amplifier AMP1. Meanwhile, in a case in which the switch SW_G is turned OFF, the voltage output from the buffer amplifier BAMP2 is input to the inverting input terminal of the amplifier AMP1.

The CNT 12 individually controls all of the switches SW of the semiconductor device 10 ON and OFF, based on a control signal input from a memory control unit (MCU) provided outside the semiconductor device 10.

Note that a parasitic capacitance C1 illustrated in FIG. 1 is a parasitic capacitance occurring between the buffer amplifier BAMP1 and the low pass filter LPF. A parasitic capacitance C2 illustrated in FIG. 1 is a parasitic capacitance occurring between the buffer amplifier BAMP2 and the low pass filter LPF. The voltage applied (input) to the buffer amplifier BAMP1 is accumulated in the buffer amplifier BAMP1, the capacitance element CLpf included in the low pass filter LPF and the parasitic capacitance C. The voltage applied (input) to the buffer amplifier BAMP2 is accumulated in the buffer amplifier BAMP2, the capacitance element CLpf included in the low pass filter LPF and the parasitic capacitance C2. Note that, in FIG. 1, the parasitic capacitances C1 and C2 are described as capacitance elements in order to explain the parasitic capacitances C1 and C2 for convenience. Thus, the capacitances are not practically connected to the non-inverting input terminals of the buffer amplifiers BAMP1 and BAMP2.

Figure 2:
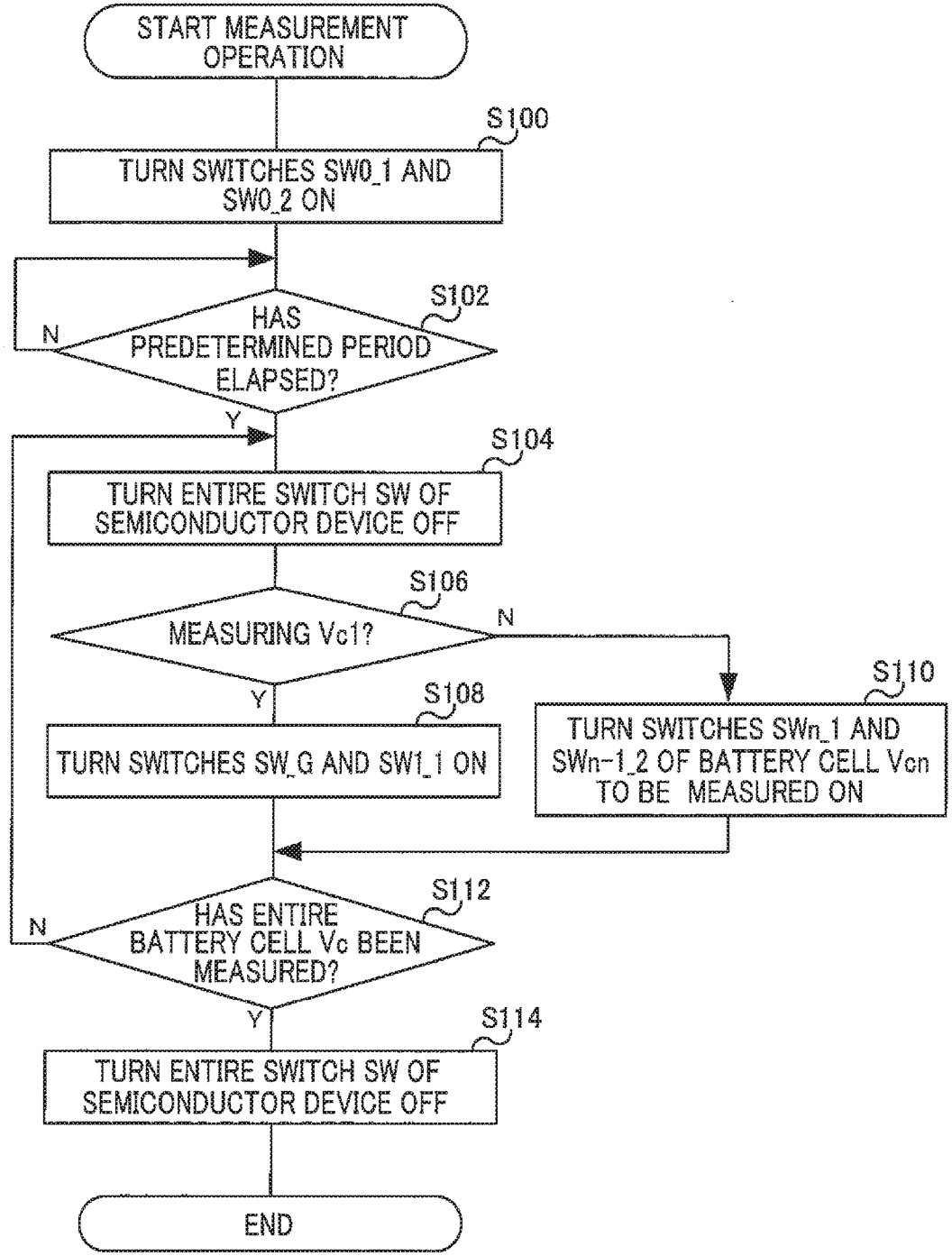
FIG. 2 is a flow chart illustrating a measurement operation of a battery voltage of a battery cell in the semiconductor device according to the exemplary embodiment.

Next, measurement operation of the battery voltage of the battery cell Vc in the semiconductor device 10 according to the present exemplary embodiment will be described with reference to the drawings. FIG. 2 is a flow chart illustrating the measurement operation in the semiconductor device 10 according to the exemplary embodiment. Note that, in the present exemplary embodiment, a case in which a battery voltage of each battery cell Vc is measured sequentially from the lowermost stage battery cell Vc1 to the uppermost stage battery cell Vc4 will be described.

The measurement operation illustrated in FIG. 2 is performed in a case in which the CNT12 receives, from the MCU, the control signal that is an instruction for measuring the battery voltage. Note that, in the semiconductor device 10 according to the exemplary embodiment, all of the switches SW of the semiconductor device 10 are turned OFF at a start of the measurement operation.

Figure 3:
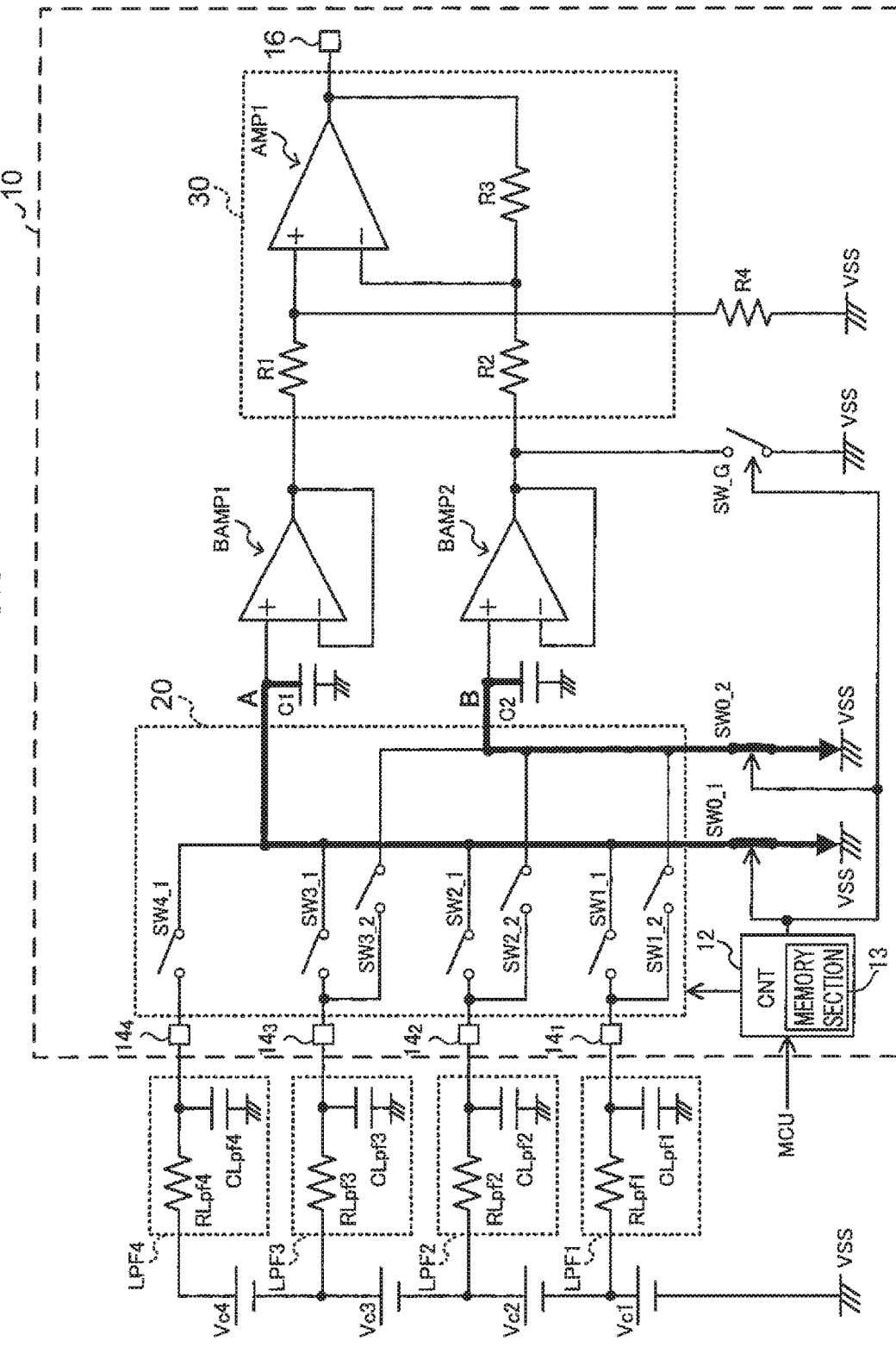
FIG. 3 is a circuit diagram illustrating a flow of electric charges in a case in which switches SW0_1 and SW0_2 are turned ON in the semiconductor device according to the exemplary embodiment.

At step S100, the CNT 12 turns the switches SW0_1 and SW0_2 ON before the battery voltage of the lowermost stage battery cell Vc1 at the lowermost stage is measured. FIG. 3 is a circuit diagram illustrating a flow of electric charges in a case in which the switches SW0_1 and SW0_2 are turned ON.

Since the switch SW0_1 is ON, electric charges accumulated in the parasitic capacitance C1 are discharge to the reference voltage VSS as an arrow A illustrated in FIG. 3. Further, since the switch SW0_2 is ON, electric charges accumulated in the parasitic capacitance C2 are discharge to the reference voltage VSS as an arrow B illustrated in FIG. 3.

At step S102, the CNT 12 determines whether or not a predetermined period has elapsed. In the semiconductor device 10 according to the present exemplary embodiment, sufficient period of time for the electric charges accumulated in each of the parasitic capacitances C1 and C2 to discharge is achieved by, for example, experiment, and the sufficient period of time is previously stored in a memory section 13 in the CNT 12 as the predetermined period. The CNT 12 remains in a standby mode until the predetermined period elapses. In a case in which the predetermined period has elapsed, the processing proceeds to step S104.

At step S104, the CNT 12 turns all of the switches SW of the semiconductor device 10 OFF. Note that, in a case in which the processing has proceeded to S104 from S102, the switches SW0_1 and SW0_2 are turned OFF from a state where the switches SW0_1 and SW0_2 are ON.

At S106, the CNT 12 determines whether or not to measure the battery voltage of the battery cell Vc1. In a case in which the battery cell Vc1 is to be measured, the processing proceeds to step S108.

Figure 4:
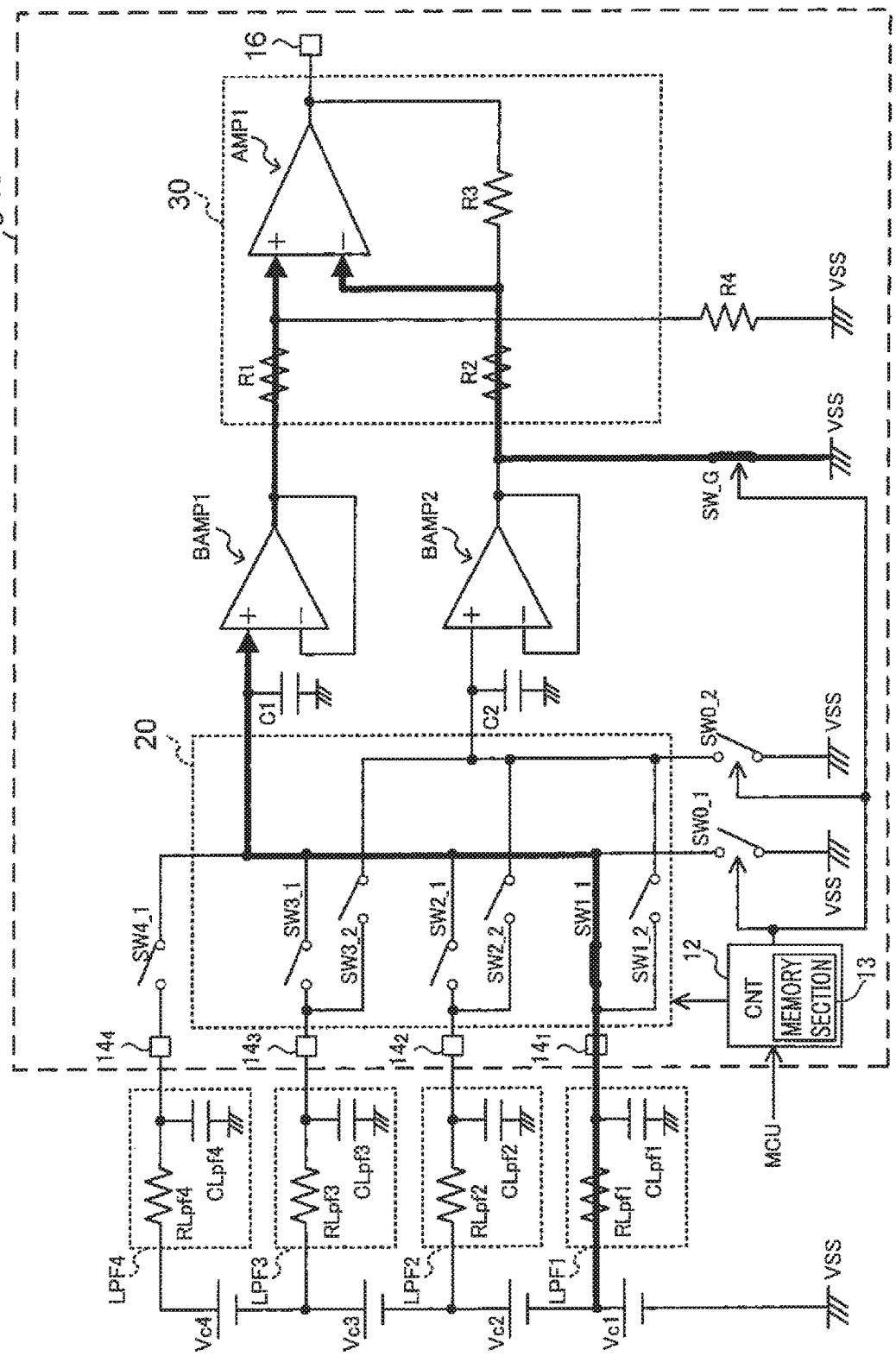
FIG. 4 is a circuit diagram illustrating a flow of electric charges in a case in which switches SW_G and SW1_1 are turned ON in the semiconductor device according to the exemplary embodiment.

At step S108, the CNT 12 turns the switch SW1_1 in the switch group 20 and the switch SW_G ON. The switch SW1_1 corresponds to the battery cell Vc1 selected in order to measure the battery voltage. FIG. 4 is a circuit diagram illustrating a flow of electric charges in a case in which the switches SW_G and SW1_1 are turned ON.

The voltage of the high potential side of the battery cell Vc1 is input to the non-inverting input terminal of the buffer amplifier BAMP1 through the low pass filter LPF1, the input terminal $14_1$, and the switch SW1_1. Note that, since the electric charges accumulated in the parasitic capacitance C1 have been discharged by step S100, a voltage corresponding to the electric charges accumulated in the parasitic capacitance C1 is not input to the non-inverting input terminal of the buffer amplifier BAMP1.

A voltage output from the buffer amplifier BAMP1 is input to the non-inverting input terminal of the amplifier AMP1 of the analog level shifter 30.

Meanwhile, the reference voltage VSS is input to the inverting input terminal of the amplifier AMP1 of the analog level shifter 30 through the switch SW_G.

Accordingly, the amplifier AMP1 of the analog level shifter 30 outputs a voltage corresponding to a difference between the voltage output from the buffer amplifier BAMP1 and the reference voltage VSS. Namely, the amplifier AMP1 outputs a voltage corresponding to a difference between the voltage of the high potential side of the battery cell Vc1 and the reference voltage VSS. The low potential side of the battery cell Vc1 is connected to the reference voltage VSS. Thus, the amplifier AMP1 outputs a voltage corresponding to the battery voltage of the battery cell Vc1.

Here, an effect of the parasitic capacitances C1 and C2 to the measurement of the battery voltage of the battery cell Vc will be described.

In a case in which the battery voltage of the battery cell Vc is measured, a voltage corresponding to the battery voltage of each battery cell Vc is input to the buffer amplifiers BAMP1 and BAMP2. Accordingly, parasitic capacitances occur and electric charges are accumulated in each of the parasitic capacitances C1 and C2. In a case in which the battery voltage of the battery cell Vc is measured and the electric charges have been accumulated in each of the parasitic capacitances C1 and C2, in addition to the battery voltage of the battery cell Vc to be measured, a voltage corresponding to the electric charges accumulated in the parasitic capacitance C1 and a voltage corresponding the electric charges accumulated in the parasitic capacitance C2 are input to the buffer amplifiers BAMP1 and BAMP2, respectively.

Figure 5:
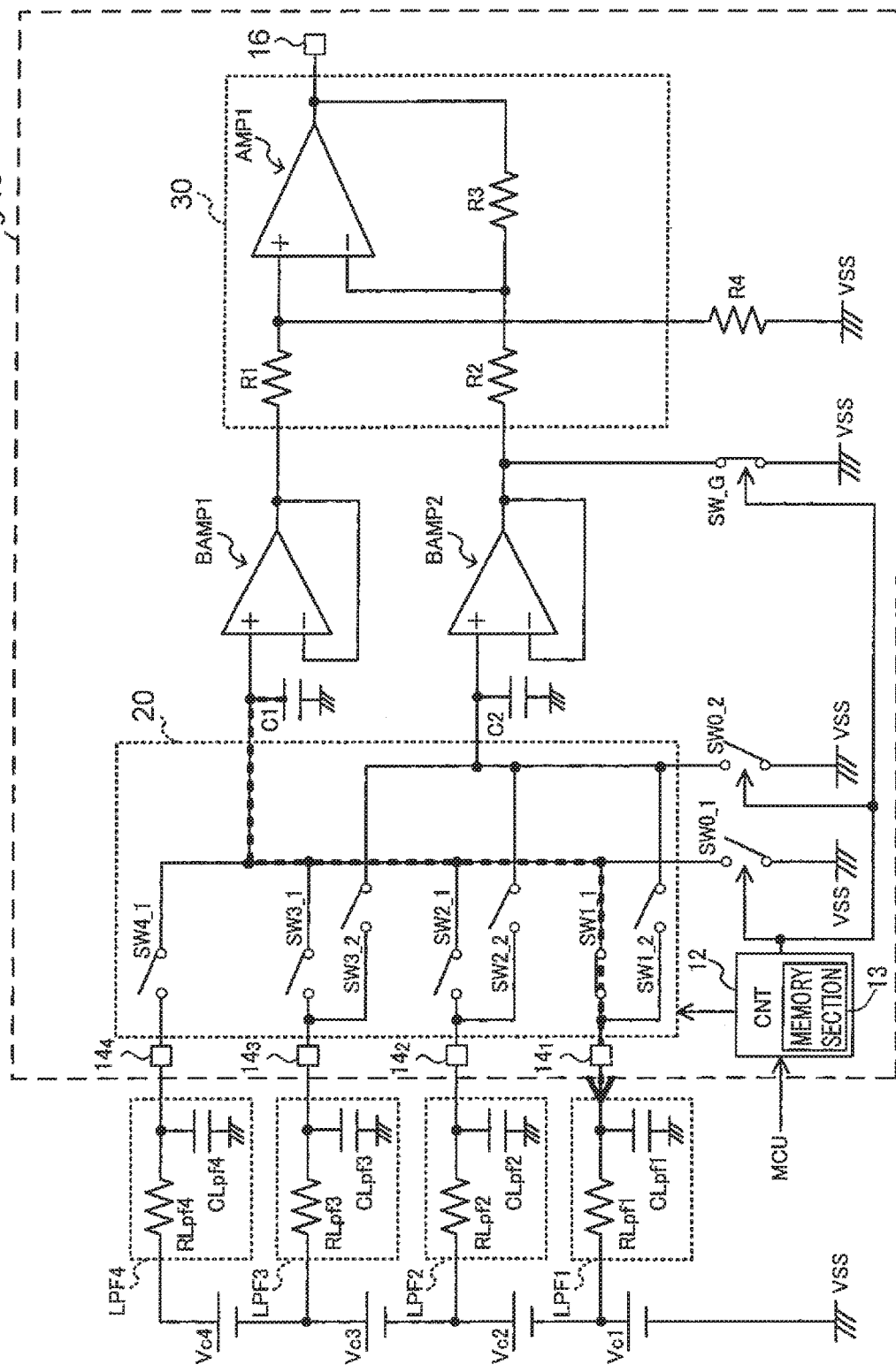
FIG. 5 is a circuit diagram for describing an effect of a parasitic capacitance in a case in which a battery voltage of a lowermost stage battery cell is measured in the semiconductor device according to the exemplary embodiment.

FIG. 5 is a circuit diagram for describing the effect of the parasitic capacitances C1 and C2 in a case in which the battery voltage of the battery cell Vc1 is measured. Note that, as described above, in the case in which the battery voltage of the battery cell Vc1 is measured, no electric charges are accumulated in each of the parasitic capacitances C1 and C2. However, here, a case in which electric charges are assumed to be accumulated in each of the parasitic capacitances C1 and C2, will be described.

As illustrated in FIG. 5, since the switch SW1_1 is ON, the electric charges accumulated in the parasitic capacitance C1 are discharged to the low pass filter LPF1 through the switch SW1_1 and the input terminal $14_1$. As a result, electric current flows through the low pass filter LPF1 and the voltage of the high potential side of the battery cell Vc1 and the voltage corresponding to the electric charges accumulated in the parasitic capacitance C1 are input to the non-inverting input terminal of the buffer amplifier BAMP1. Accordingly, a voltage that includes the voltage of the high potential side of the battery cell Vc1 and the voltage corresponding to the electric charges accumulated in the parasitic capacitance C1, is input to the non-inverting input terminal of the amplifier AMP1 of the analog level shifter 30. Meanwhile, the reference voltage VSS is input to the inverting terminal of the amplifier AMP1 regardless of the electric charges accumulated in each of the parasitic capacitances C1 and C2. The amplifier AMP1 outputs a voltage corresponding to a difference between the voltage of the high potential side of the battery cell Vc1 plus the voltage corresponding to the electric charges accumulated in the parasitic capacitance C1 and the reference voltage VSS.

The reference voltage VSS remains substantially constant. Meanwhile, the electric charges accumulated in the parasitic capacitance C1 vanes in accordance with the voltage input to the non-inverting input terminal of the buffer amplifier BAMP1. As described above, in the semiconductor device 10 according to the present exemplary embodiment, the measurement of the battery cell Vc1 is started again in the following measurement, after the battery voltage of the battery cell Vc4 has been measured. Therefore, in the case in which the battery voltage of the battery cell Vc1 is measured, the amount of the electric charges accumulated in the parasitic capacitance C1 is the amount of electric charges corresponding to the voltage of the high potential side of the battery cell Vc4. The amount of the electric charges accumulated in the parasitic capacitance C1 increases as the voltage input to the non-inverting input terminal of the buffer amplifier BAMP1 increases. Accordingly, the amount of the electric charges accumulated in the parasitic capacitance C1 increases after the battery voltage of the battery cell Vc4 is measured. In the present exemplary embodiment, the number of the battery cells Vc connected in series is set to four. However, the amount of the electric charges accumulated in the parasitic capacitance C1 increases as the number of the battery cells Vc increases. Therefore, in the measurement of the battery voltage of the battery cell Vc1, the voltage corresponding to the electric charges accumulated in the parasitic capacitance C1 cannot be negligible as an error. As a result, a value of the difference between the voltage of the high potential side of the battery cell Vc1 plus the voltage corresponding to the electric charges accumulated in the parasitic capacitance C1 and the reference voltage VSS, may become different from a value of the battery voltage of the battery cell Vc1.

In contrast, in the semiconductor device 10 according to the present exemplary embodiment, as described above, the electric charges accumulated in each of the parasitic capacitance C1 and C2 are discharge by the processing of step S100. Therefore, no electric charges flows through the low pass filter LPF (refer to FIG. 5) and occurrence of the error caused by the electric charges accumulated in each of the parasitic capacitances C1 and C2 may be prevented. As a result, the amplifier AMP1 outputs a voltage corresponding the battery voltage of the battery cell Vc1.

After the measurement of the battery voltage of the battery cell Vc1 is completed, at step S112, the CNT 12 determines whether or not the battery voltage of all of the battery cells Vc has been measured. In a case in which there is the battery cell Vc that has not been measured, the processing proceeds to step S104. After the battery voltage of the battery cell Vc1 has been measured, since measurement of the battery voltages of the battery cells Vc2 to Vc4 remains, the processing proceeds to step S104 and then the battery voltage of the battery cell Vc2 at the following stage is measured.

The CNT12 turns all of the switches SW of the semiconductor device 10 OFF at step S104 in order to measure the battery voltage of the battery cell Vc2.

At step S106, the CNT 12 determines whether or not the battery voltage of the battery cell Vc1 has been measured. In a case in which the battery voltage of the battery cell (the battery cells Vc2 to Vc4) other than the battery cell Vc1 is to be measured, the processing proceeds to step S110.

Figure 6:
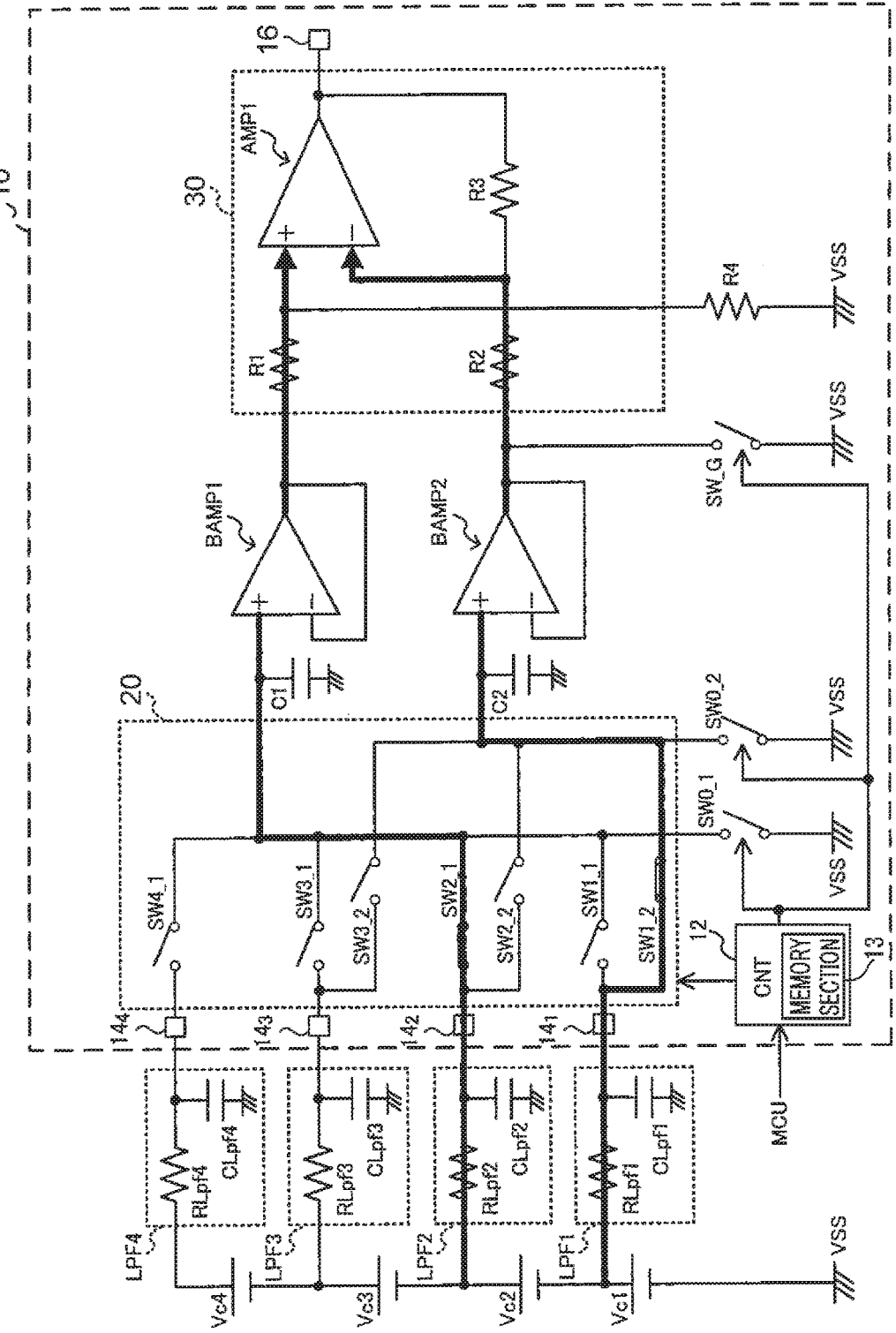
FIG. 6 is a circuit diagram illustrating a flow of electric charges in a case in which switches SW2_1 and SW1_2 are turned ON in the semiconductor device according to the exemplary embodiment.

At step S110, the CNT 12 turns the switches SWn_1 and SWn-1_2 in the switch group 20 ON. The switches SWn_1 and SWn-1_2 in the switch group 20 correspond to the battery cell Vcn (n is an integer from 2 to 4) that has been selected in order to measure the battery voltage. In a case in which the battery voltage of the battery cell Vc2 is measured (n=2), the switches SW2_1 and SW1_2 are turned ON. FIG. 6 is a circuit diagram illustrating a flow of electric charges in a case in which the switches SW2_1 and SW1_2 are turned ON.

The voltage of the high potential side of the battery cell Vc2 is input to the non-inverting input terminal of the buffer amplifier BAMP1 through the low pass filter LPF2, the input terminal $14_2$, and the switch SW2_1. A voltage output from the buffer amplifier BAMP1 is input to the non-inverting input terminal of the amplifier AMP1 of the analog level shifter 30.

Meanwhile, the voltage of the low potential side of the battery cell Vc2 is input to the non-inverting input terminal of the buffer amplifier BAMP2 through the low pass filter LPF1, the input terminal $14_1$, and the switch SW1_2. Since the electric charges accumulated in the parasitic capacitance C2 have discharged by the step S100, the voltage corresponding to the electric charges accumulated in the parasitic capacitance C2 is not input to the non-inverting input terminal of the buffer amplifier BAMP2. A voltage output from the buffer amplifier BAMP2 is input to the inverting input terminal of the amplifier AMP1 of the analog level shifter 30.

Accordingly, the amplifier AMP1 of the analog level shifter 30 outputs a voltage corresponding to a difference between the voltage output from the buffer amplifier BAMP1 and the voltage output from the buffer amplifier BAMP2. Namely, since the amplifier AMP1 outputs a voltage corresponding to a difference between the voltage of the high potential side of the battery cell Vc2 and the voltage of the low potential side of the battery cell Vc2, the amplifier AMP1 outputs a voltage corresponding to the battery voltage of the battery cell Vc2.

After the measurement of the battery voltage of the battery cell Vc2 is completed, at the following step S112, the CNT 12 determines whether or not the battery voltage of all of the battery cells Vc have been measured. Thereafter, the processing of steps S104, S106, S110, and S112 is repeated until the measurement of the battery voltage of all of the battery cells Vc is completed Meanwhile, in a case in which the measurement of the battery voltage of all of the battery cells Vc has been completed, the processing proceeds from step S112 to step S114.

At step S114, the CNT 12 turns all of the switches SW of the semiconductor device 10 OFF and then ends processing. Thus, the measurement of each battery voltage of the battery cell Vc in one cycle is competed.

Note that, in a case in which the battery voltage of the battery cells Vc are sequentially measured from the lowermost stage to the uppermost stage, and when the battery voltage of the battery cell Vc at a post stage is measured, the electric charges may be accumulated in each of the parasitic capacitances C1 and C2. However, there is little effect on the measurement of the battery voltage.

As a specific example, an effect of the parasitic capacitances C1 and C2 on measurement of the battery cell Vc3 in the semiconductor device 10 according to the present exemplary embodiment will be described. Upon the measurement of the battery cell Vc3, electric charges have been accumulated in each of the parasitic capacitances C1 and C2 since the measurement of the battery voltage of each of the battery cells Vc1 and Vc2 has been performed.

Therefore, the amplifier AMP1 of the analog level shifter 30 outputs a voltage corresponding to a difference between a voltage corresponding to the voltage of the high potential side of the battery cell Vc3 plus a voltage corresponding to the electric charges accumulated in the parasitic capacitance C1, and a voltage of the low potential side of the battery cell Vc3 plus a voltage corresponding to the electric charges accumulated in the parasitic capacitance C2. In this case, a difference between the voltage corresponding to the electric charges accumulated in the parasitic capacitance C1 and the voltage corresponding to the electric charges accumulated in the parasitic capacitance C2, is relatively small. For example, the electric charges accumulated in each of the parasitic capacitances C1 and C2 are extremely smaller than the electric charges accumulated in the parasitic capacitance C1 after the measurement of the battery cell Vc4, as described above. Accordingly, there is little effect of the electric charges accumulated in each of the parasitic capacitances C1 and C2 on the measurement of the battery voltage. Therefore, it can be said that the voltage output from the amplifier AMP1 is the battery voltage of the battery cell Vc3.

As described above, the semiconductor device 10 according to the present exemplary embodiment includes the buffer amplifiers BAMP1 and BAMP2, the switches SW0_1 and SW_G, and the analog level shifter 30. In order to measure the battery voltage, the voltage of the high potential side of one battery cell Vc selected from the plural battery cells Vc, which is connected in series from the lowermost stage battery cell Vc1 to the uppermost stage battery cell Vc4, is input to the buffer amplifier BAMP1. The voltage of the low potential side of the battery cell Vc in which the battery voltage is measured, other than the lowermost stage battery cell Vc1 in the battery cells Vc (the battery cells Vc2 to Vc4), is input to the buffer amplifier BAMP2. The voltage output from the buffer amplifier BAMP1 and the voltage output from the buffer amplifier BAMP2 are input to the amplifier AMP1 of the analog level shifter 30. In a case in which the battery voltage of the battery cell Vc1 is measured, the switch SW_G switches a voltage input to the amplifier AMP1 from the voltage output from the buffer amplifier BAMP2 to the reference voltage VSS. The switch SW0_1 switches the voltage input to the buffer amplifier BAMP1 from the voltage of the high potential side of the battery cell Vc to be measured, to the reference voltage VSS. The semiconductor device 10 according to the present exemplary embodiment includes the switch SW0_2 that switches the voltage input to the buffer amplifier BAMP2 to the reference voltage VSS.

In the semiconductor device 10 according to the present exemplary embodiment, in the measurement of the battery voltage in one cycle, the battery voltage of each of the battery cells Vc is sequentially measured from the lowermost stage battery cell Vc1 to the uppermost stage battery cell Vc4. The CNT 12 in the semiconductor device 10 turns the switches SW0_1 and SW0_2 ON and then discharges the electric charges accumulated in each of the parasitic capacitances C1 and C2 before the measurement of the battery voltage, namely, before the measurement of the battery voltage of the battery cell Vc1.

In the semiconductor device 10 according to the present exemplary embodiment, in the case in which the battery voltage of the battery cell Vc1 is measured, the CNT 12 turns the switches SW1_1 and SW_G ON.

Accordingly, in the case in which the battery voltage of the battery cell Vc1 is measured, the voltage of the high potential side of the battery cell Vc1, output from the buffer amplifier BAMP1 is input to the non-inverting input terminal of the amplifier AMP1. The reference voltage VSS is input to the inverting input terminal of the amplifier AMP1. The amplifier AMP1 outputs the voltage corresponding to the battery voltage of the battery cell Vc1.

As described above, the semiconductor device 10 according to the present exemplary embodiment may prevent the effect of the parasitic capacitances C1 and C2 in a case in which the battery voltage of the battery cell Vc1 is measured. Accordingly, the measurement error caused by the electric charges accumulated in the parasitic capacitances C1 and C2 occurring in the measurement of the battery voltage of the battery cell Vc, may be prevented.

The semiconductor device 10 according to the present exemplary embodiment includes the switch SW_G. The battery voltage of the battery cell Vc1 is measured by the difference between the voltage of the high potential side of the battery cell Vc1 and the reference voltage VSS. Therefore, the number of the terminals (the terminal 14) can be reduced when compared to a conventional semiconductor device.

Figure 8:
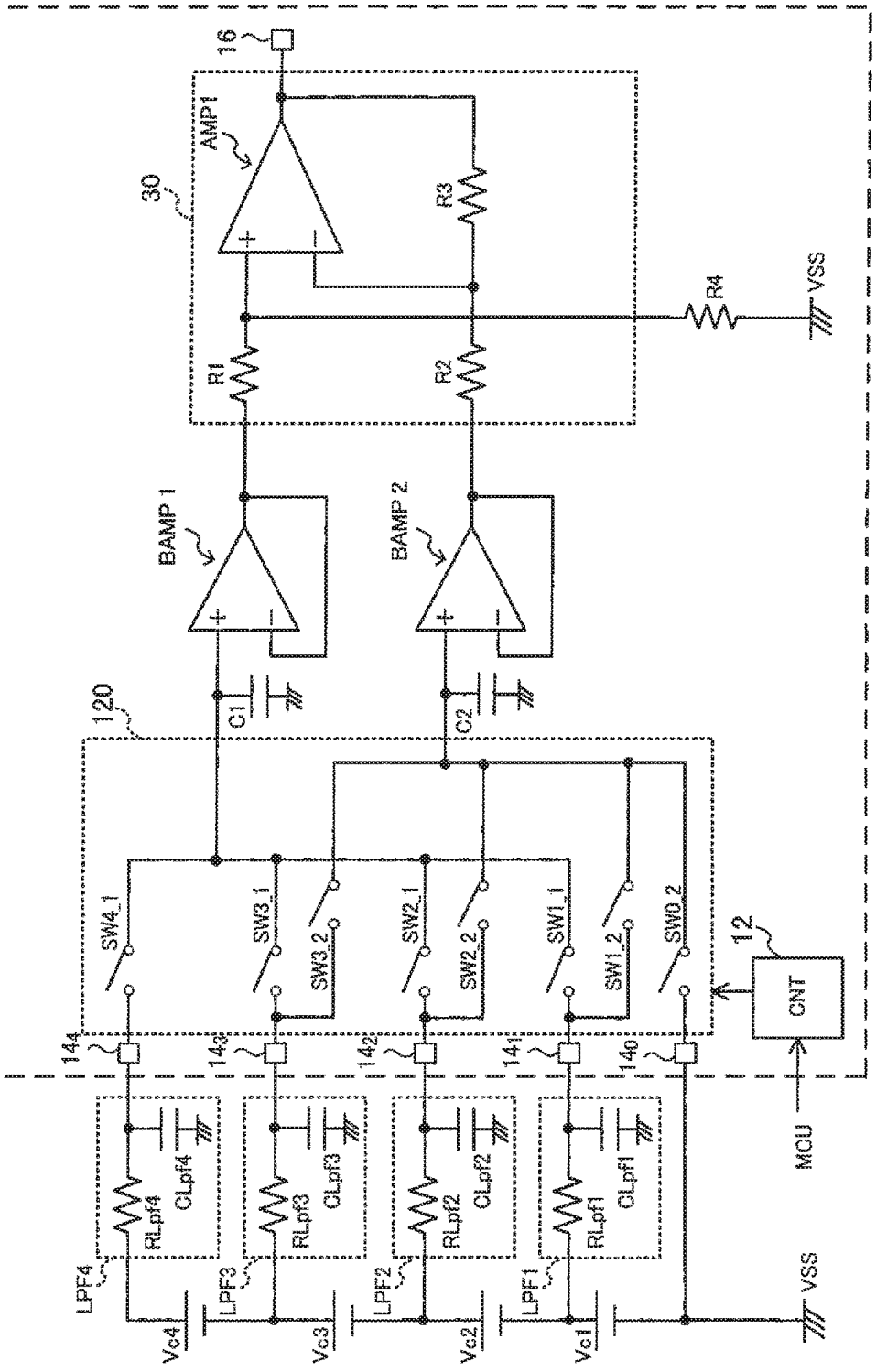
FIG. 8 is a circuit diagram of a conventional semiconductor device.

In a conventional semiconductor device for measuring the battery voltage of the battery cell Vc, in a case in which the battery voltage of the battery cell Vc1 is measured, the voltage of the high potential side and the voltage of the low potential side of the battery cell Vc1 are input to the semiconductor device, in the same manner as the measurement of the battery voltages of the battery cells Vc2 to Vc4 in the semiconductor device 10 according to the present exemplary embodiment. FIG. 8 is a circuit diagram of the conventional semiconductor device. The conventional semiconductor device 100 illustrated in FIG. 8 includes an input terminal $14_0$ that is connected to the voltage of the low potential side of the battery cell Vc1. A switch group 120 of the conventional semiconductor device 100 includes a switch SW0_2 for inputting the voltage of the low potential side of the battery cell Vc1 to a non-inverting input terminal of the buffer amplifier BAMP2 through the input terminal $14_0$ in a case in which the battery voltage of the battery cell Vc1 is to be measured.

In the semiconductor device 10 according to the present exemplary embodiment, since the voltage of the low potential side of the battery cell Vc1 is not input, the input terminal $14_0$ included in the conventional semiconductor device 100 is not needed. As a result, the input terminal $14_0$ may be reduced and the number of the input terminals 14 may be reduced in the semiconductor device 10 according to the present exemplary embodiment.

Note that, according to the present exemplary embodiment, the battery voltage of each battery cell Vc is sequentially measured from the lowermost stage battery cell Vc1 to the uppermost stage battery Vc4. However, the measurement order of the battery cell Vc is not limited to this. For example, the measurement of the battery voltage of each battery cell Vc may be sequentially performed from the uppermost stage battery cell Vc4 to the lowermost stage battery cell Vc1. In such case, after the measurement of the battery voltage of the battery cell Vc2 and before the measurement of the battery cell Vc1, the CNT 12 may turn the switches SW0_1 and SW0_2 ON so as to discharge the electric charges accumulated in the parasitic capacitances C1 and C2. Thus, the effect of the parasitic capacitances C1 and C2 when measuring the battery voltage of the battery cell Vc1 may be prevented.

Figure 7:
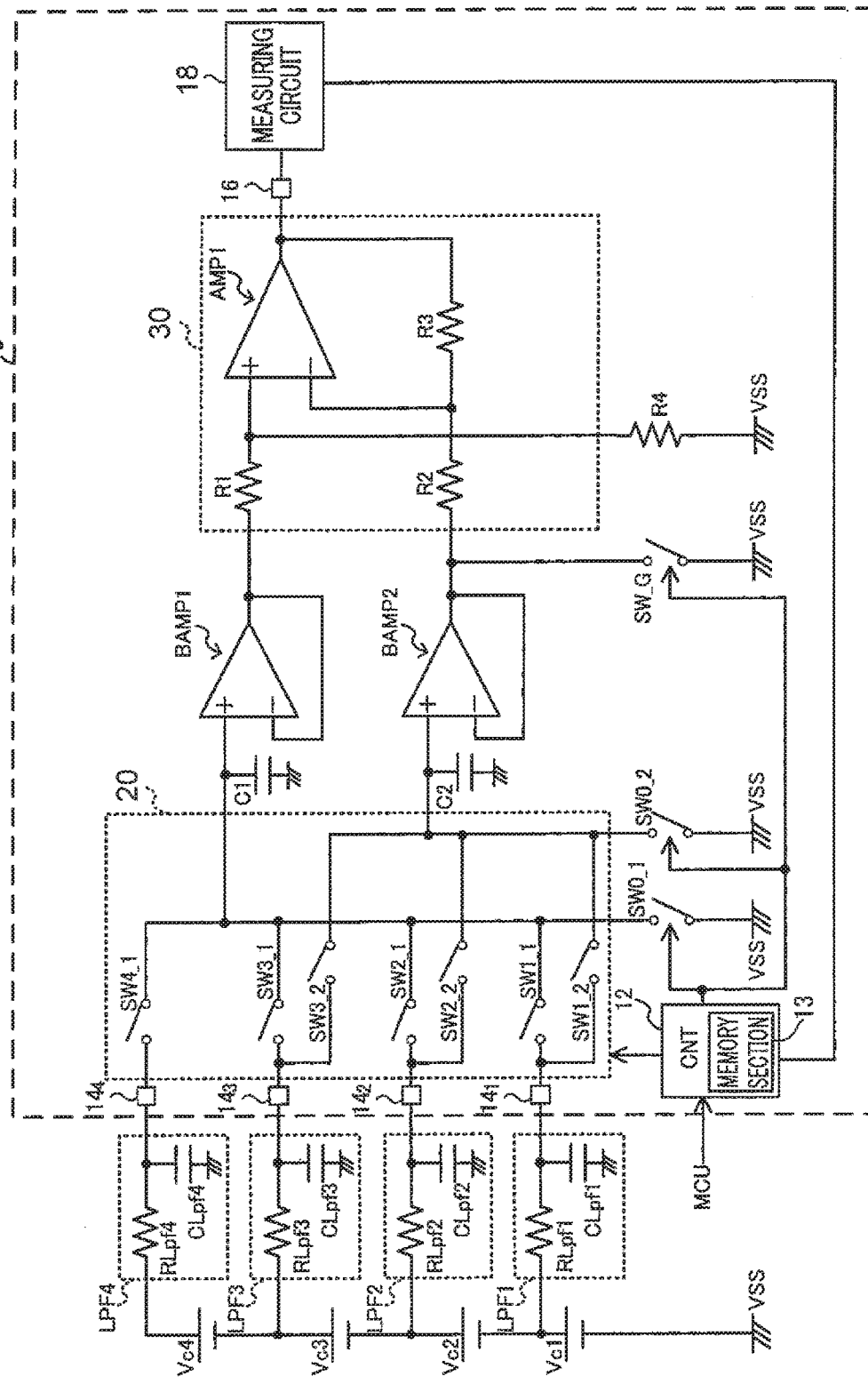
FIG. 7 is another circuit diagram of the semiconductor device according to the exemplary embodiment.

In the measurement operation of the semiconductor device 10 according to the present exemplary embodiment, the CNT 12 turns the switches SW0_1 and SW0_2 OFF after turning the switches SW0_1 and SW0_2 ON and after the predetermined period, in which the electric charges accumulated in the parasitic capacitances C1 and C2 are sufficiently discharged, elapses. However, timing in which the CNT 12 switches the switches SW0_1 and SW0_2 from the ON to the OFF is not limited to the above, and other timing may be applied. The semiconductor device 10 in which the CNT 12 switches the switches SW0_1 and SW0_2 from ON to OFF at other timing, will be described with reference to FIG. 7. FIG. 7 is another exemplary circuit diagram of the semiconductor device 10 according to the present exemplary embodiment. The semiconductor device 10 illustrated in FIG. 7 includes a measuring circuit 18 that measures a voltage output from the analog level shifter 30. A result measured by the measuring circuit 18 is input to the CNT 12. The measuring circuit 18 measures the voltage output from the analog level shifter 30, determines whether or not the voltage is substantially zero, and outputs a determined result.

The CNT 12 first turns the switches SW0_1 and SW_G ON and turns the others OFF so that the analog level shifter 30 outputs a voltage corresponding to a difference between a voltage output from the buffer amplifier BAMP1 and the reference voltage VSS. In a case in which electric charges have been accumulated in the parasitic capacitance C1, a potential difference occurs. The measuring circuit 18 outputs whether or not there is the potential difference as a measurement result, to the CNT 12. In a case in which the potential difference disappears, next, the CNT 12 turns the switch SW_G OFF and turns the switch SW0_2 ON. In a case in which electric charges have been accumulated in the parasitic capacitance C2, a potential difference occurs. The measuring circuit 18 outputs whether or not there is the potential difference as a measurement result, to the CNT 12. After the potential difference disappears, the CNT 12 performs the measurement of the battery cell Vc (steps S104 to S114 of the measurement operation illustrated in FIG. 2). As described above, based on the potential difference measured by the measuring circuit 18, the CNT 12 controls the switches SW0_1 and SW0_2 so that the electric charges accumulated in each of the parasitic capacitances C1 and C2 are securely discharged. Note that the measuring circuit 18 may be provided outside the semiconductor device 10.

In the present exemplary embodiment, a case in which the semiconductor device 10 included the switches SW0_1 and SW0_2, has been described. However, the electric charges accumulated in the parasitic capacitance C1 may be discharged in a case in which only the switch SW0_1 is provided. As described above, since the parasitic capacitance C1 mainly effects in the case in which the battery voltage of the battery cell Vc1 is measured, once the electric charges accumulated in the parasitic capacitance C1 are discharged, the battery voltage of the battery cell Vc1 may be appropriately measured. Note that the effect of the parasitic capacitance C2 on the measurement of the battery voltage of the battery cell Vc2 may be prevented by providing the switch SW0_2. Therefore, the switch SW0_2 is preferably provided in terms of the measurement of the battery voltage of the battery cell Vc2.

For example, the number of the battery cells Vc described in the semiconductor device 10 according to the present exemplary embodiment is one example, and is not limited thereto.

For example, the configurations and the measurement operation of the semiconductor device 10 described in the present exemplary embodiment are examples. Needless to say, alternations may be made without departing from the spirit of the present disclosure.

What is claimed is:

1. A semiconductor device comprising:
   a first buffer amplifier into which a voltage of a high potential side of one battery cell is input, the one battery cell selected from a plurality of battery cells that are connected in series from a lowermost stage battery cell to an uppermost stage battery cell;
   a second buffer amplifier into which a voltage of a low potential side of the one battery cell selected from the plurality of battery cells other than the lowermost stage battery cell is input;
   an analog level shifter into which a voltage output from the first buffer amplifier and a voltage output from the second buffer amplifier are input;
   a first switch that switches a voltage input to the analog level shifter from the voltage output from the second buffer amplifier to a reference voltage;
   a second switch that switches a voltage input to the first buffer amplifier from the voltage of the high potential side of the one battery cell selected from the plurality of battery cells to the reference voltage; and
   a control section that controls the first switch and the second switch so as to
   input a voltage of the high potential side of the lowermost stage battery cell to the first buffer amplifier, and input the reference voltage to the analog level shifter, in a case in which a battery voltage of the lowermost stage battery cell is measured,
   input the voltage of the high potential side of the battery cell to be measured to the first buffer amplifier, and input a voltage of a low potential side of the battery cell to be measured to the analog level shifter, in a case in which the battery voltage of the battery cell other than the lowermost stage battery cell is measured, and
   input the reference voltage to the first buffer amplifier before the battery voltage of the lowermost stage battery cell is measured.

2. The semiconductor device according to claim 1, further comprising a third switch that switches the voltage to input to the second buffer amplifier to the reference voltage.

3. The semiconductor device according to claim 1, further comprising a third switch that switches the voltage input to the second buffer amplifier to the reference voltage,
   wherein the control section further controls the third switch so as to input the reference voltage to the second buffer amplifier before the battery voltage of the lowermost stage battery cell is measured.

4. A battery voltage measuring method using a semiconductor device including, a first buffer amplifier into which a voltage of a high potential side of one battery cell is input, the one battery cell selected from a plurality of battery cells that are connected in series from a lowermost stage battery cell to an uppermost stage battery cell, a second buffer amplifier into which a voltage of a low potential side of the one battery cell selected from the plurality of battery cells other than the lowermost stage battery cell is input, an analog level shifter into which a voltage output from the first buffer amplifier and a voltage output from the second buffer amplifier are input, a first switch that switches a voltage input to the analog level shifter from the voltage output from the second buffer amplifier to a reference voltage, and a second switch that switches a voltage input to the first buffer amplifier from the voltage of the high potential side of the one battery cell selected from the plurality of battery cells to the reference voltage, the method comprising:

selecting the lowermost stage battery cell, inputting a voltage of a high potential side of the lowermost stage battery cell to the first buffer amplifier, and controlling the first switch so as to input the reference voltage to the analog level shifter, in a case in which the battery voltage of the lowermost stage battery cell is measured;

selecting a battery cell to be measured, inputting the voltage of a high potential side of the battery cell to be measured to the first buffer amplifier, and inputting a voltage of a low potential side of the battery cell to be measured into the analog level shifter, in a case in which the battery voltage of the battery cell other than the lowermost stage battery cell is measured; and controlling the second switch so as to input the reference voltage to the first buffer amplifier before the battery voltage of the lowermost stage battery cell is measured.

\* \* \* \* \*